(12) United States Patent
Yamada

(10) Patent No.: US 9,153,637 B2
(45) Date of Patent: Oct. 6, 2015

(54) OLED DISPLAY DEVICE

(71) Applicant: Japan Display Inc., Tokyo (JP)

(72) Inventor: Yasuyuki Yamada, Tokyo (JP)

(73) Assignee: Japan Display Inc., Tokyo (JP)

( * ) Notice: Subject to any disclaimer, the term of this patent is extended or adjusted under 35 U.S.C. 154(b) by 67 days.

(21) Appl. No.: 14/093,148

(22) Filed: Nov. 29, 2013

(65) Prior Publication Data

US 2014/0152636 A1   Jun. 5, 2014

(30) Foreign Application Priority Data

Nov. 30, 2012   (JP) ................................. 2012-261961

(51) Int. Cl.
*G09G 5/00* (2006.01)
*H01L 27/32* (2006.01)
*H01L 51/52* (2006.01)

(52) U.S. Cl.
CPC .... *H01L 27/3279* (2013.01); *G09G 2300/0842* (2013.01); *G09G 2300/0861* (2013.01); *G09G 2320/0223* (2013.01); *G09G 2320/045* (2013.01); *H01L 51/524* (2013.01)

(58) Field of Classification Search
CPC . G09G 3/3275; G09G 3/32; G09G 2320/045; G09G 2300/0861; G09G 2320/0223; G09G 2300/0842; H01L 51/524; H01L 27/3279
USPC ......................... 345/76–83, 90–100, 204–215
See application file for complete search history.

(56) References Cited

U.S. PATENT DOCUMENTS

| 6,961,111 | B1 | 11/2005 | Kuramasu | |
|---|---|---|---|---|
| 7,777,700 | B2 * | 8/2010 | Kwak et al. | 345/76 |
| 8,154,541 | B2 * | 4/2012 | Koyama et al. | 345/211 |
| 2005/0285108 | A1 | 12/2005 | Choi | |
| 2006/0145964 | A1 | 7/2006 | Park et al. | |
| 2006/0170634 | A1 | 8/2006 | Kwak et al. | |
| 2008/0035931 | A1 * | 2/2008 | Kwak et al. | 257/72 |
| 2008/0094009 | A1 * | 4/2008 | Koyama et al. | 315/307 |

FOREIGN PATENT DOCUMENTS

| CN | 1801298 A | 7/2006 |
|---|---|---|
| JP | 2001-154218 | 6/2001 |
| JP | 2009-212013 A | 9/2009 |
| KR | 10-2006-0087885 A | 8/2006 |

OTHER PUBLICATIONS

Office Action dated Jul. 3, 2015 regarding a corresponding Chinese Patent Application No. 201310629864.5.

* cited by examiner

*Primary Examiner* — Vijay Shankar
(74) *Attorney, Agent, or Firm* — Lowe Hauptman & Ham, LLP

(57) ABSTRACT

An OLED display device includes a first substrate including a plurality of pixels located in a matrix and a second substrate facing the first substrate. The plurality of pixels each include a pixel circuit to which a data voltage is written and an OLED display element including a first electrode supplied with a current from the pixel circuit in accordance with the data voltage, and a second electrode supplied with a power supply voltage. The first substrate and the second substrate each include a plurality of power supply lines; the plurality of power supply lines of the first substrate and the plurality of power supply lines of the second substrate are respectively connected to each other via a conductive member; and each of the plurality of power supply lines is connected to the second electrode of the OLED display element.

14 Claims, 10 Drawing Sheets

OLED DISPLAY DEVICE

CROSS-REFERENCE TO RELATED APPLICATIONS

This application is based upon and claims the benefit of priority from the prior Japanese Patent Application No. 2012-261961, filed on 30 Nov. 2012, the entire contents of which are incorporated herein by reference.

FIELD

The present invention relates to an OLED (organic light-emitting diode) display device including an OLED element.

BACKGROUND

Recently, display devices using an element which emits light at an intensity in accordance with a supplied electric current (hereinafter, such an element will be referred to as a "current light-emitting element"), for example, OLED display devices have been developed. Such a display device controls an amount of current supplied to the current light-emitting element by a driving transistor provided in each of pixels, and thus controls the gray scale of display.

Among such display devices, a type of OLED display device has a structure including a substrate on which a plurality of OLED elements and a plurality of driving transistors in correspondence with a plurality of pixels are formed (hereinafter, such a substrate will be referred to as an "array substrate"), and a counter substrate for transmitting light from the OLED elements. The counter substrate is bonded to the array substrate. The OLED elements each include a light-emitting (EL) layer. Above and below the light-emitting layer, an anode electrode and a cathode electrode for supplying a current for light emission are located. These electrodes are connected to a driver IC or an external power supply via a power supply line provided on the array substrate, and thus are supplied with a power supply voltage.

In order to minimize a transmission loss between the power supply and the electrodes, a type of conventional display device, for example, uses a thinner power supply line, uses a narrower power supply line, includes a plurality of power supply lines, or uses a power supply line formed of a plurality of layers, in an attempt to lower the resistance of the power supply line on the array substrate (see, for example, Patent Document 1: "Japanese Laid-Open Patent Publication No. 2001-154218").

However, as the screen of the display device is enlarged, lines are extended; and as the display precision is raised and the frame area becomes narrower, an area where the lines can be located is made smaller. For these and other reasons, the resistance of the power supply line on the array substrate is raised. Therefore, in the conventional display device as described above, image quality may be undesirably deteriorated for the following reasons. A voltage drop makes the luminance insufficient; and since the voltage is different between an area proximal to the power supply and an area distal from the power supply, there occurs an in-plane luminance distribution (luminance gradient).

The present invention made in light of the above-described problems solves the problem that the resistance of the power supply line is raised to cause luminance gradient, which occurs when a display device having a large screen, a high precision and a narrow frame area is designed. Namely, the present invention has an object of providing an OLED display device including low-resistance power supply lines with no luminance gradient and with no restriction by the size of the area on the array substrate where the power supply lines can be located, and thus realize improved image quality.

SUMMARY

An OLED display device in an embodiment according to the present invention includes a first substrate including a plurality of control signal lines and a plurality of data signal lines crossing each other, and a plurality of pixels located in a matrix at intersections of the plurality of control signal lines and the plurality of data signal lines; and a second substrate facing the first substrate. The plurality of pixels each include a pixel circuit to which a data voltage supplied from the corresponding data signal line is written in accordance with a control signal supplied from the corresponding control signal line; and an OLED display element including a first electrode supplied with a current from the pixel circuit in accordance with the data voltage, and a second electrode supplied with a power supply voltage. The first substrate and the second substrate each include a plurality of power supply lines; the plurality of power supply lines of the first substrate and the plurality of power supply lines of the second substrate are respectively connected to each other via a conductive member; and each of the plurality of power supply lines is connected to the second electrode of the OLED display element.

The plurality of power supply lines of the second substrate may be located in an area which does not overlap a display area of the first substrate where the plurality of pixels are located.

The conductive member may be located in an area which does not overlap a display area of the first substrate where the plurality of pixels are located, the conductive member being located as connecting the first substrate and the second substrate to each other.

The conductive member may be formed of a conductive resin or an anisotropic conductive film.

The second electrodes of the OLED display elements may form one common electrode provided in correspondence with the plurality of pixels, and the common electrode may be connected to the plurality of power supply lines at a plurality of positions and thus may be provided with the power supply voltage.

According to the present invention, the power supply lines are provided on the frame area of the counter substrate. Owing to this, the power supply lines can supply a power supply voltage with a low resistance without being restricted by the area of the array substrate where the power supply lines can be located. Therefore, an OLED display device according to the present invention can improve image quality without causing luminance gradient, which would be caused by a high resistance of the power supply lines, and also can realize a large screen, a high precision and a narrow frame area.

BRIEF DESCRIPTION OF DRAWINGS

FIG. 3(*a*)

is a plan view showing an array substrate, and FIG. 3(b) is a cross-sectional view showing the OLED display device;

FIG. 4(a) is a plan view of a counter substrate, and FIG. 4(b) is a plan view of the array substrate;

FIG. 5(a) is a plan view showing an array substrate, and FIG. 5(b) is a cross-sectional view showing the OLED display device;

FIG. 6(a) is a plan view of a counter substrate, and FIG. 6(b) is a plan view of the array substrate;

FIG. 7(a) is a plan view showing an array substrate, and FIG. 7(b) is a cross-sectional view showing the OLED display device;

FIG. 8(a) is a plan view of a counter substrate, and FIG. 8(b) is a plan view of the array substrate; FIG. 9(a) is a plan view showing an array substrate, and FIG. 9(b) is a cross-sectional view showing the OLED display device.

DESCRIPTION OF EMBODIMENTS

Hereinafter, embodiments of an OLED display device according to the present invention will be described with reference to the drawings. The OLED display device according to the present invention is not limited to the following embodiments and can be carried out in various modifications.

Figure 1:
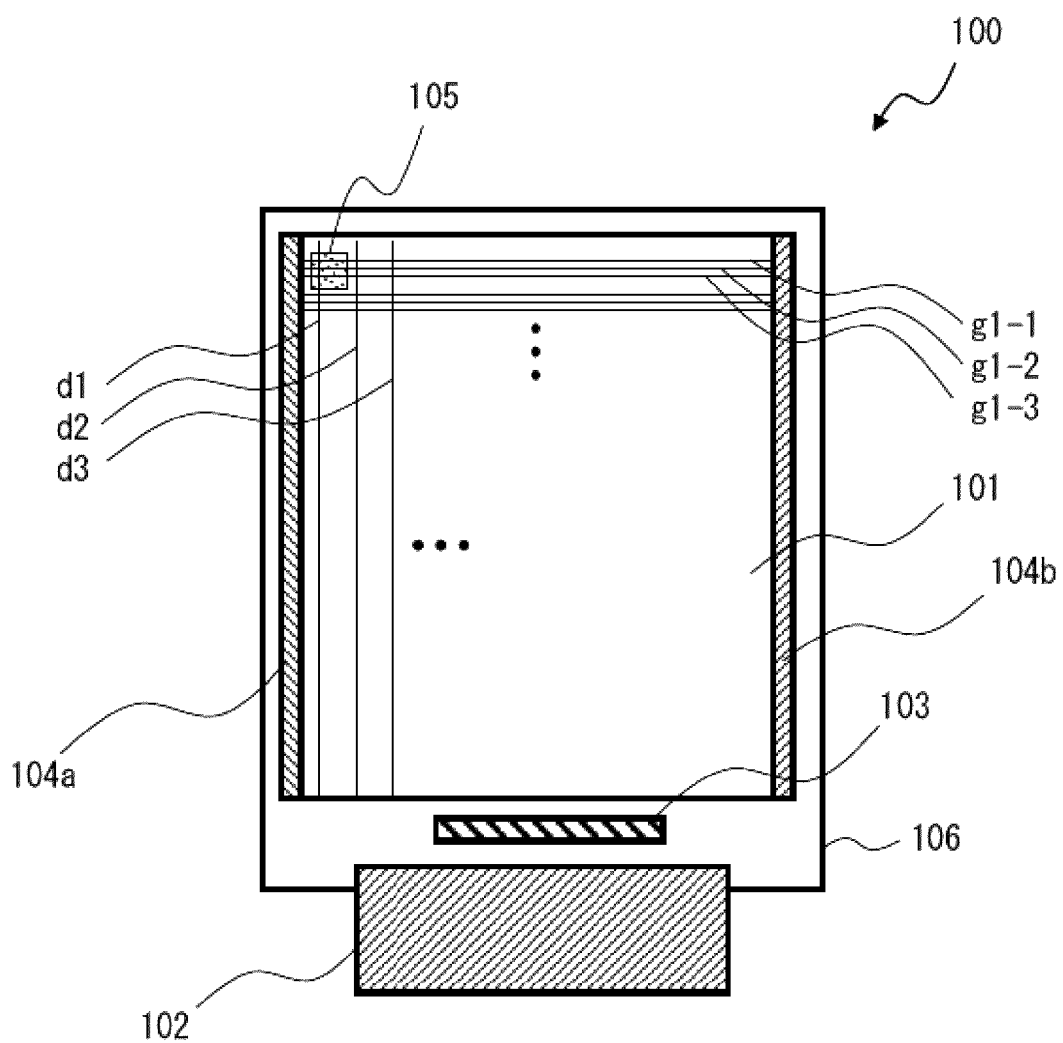
FIG. 1 is a plan view showing a schematic structure of an OLED display device in an embodiment according to the present invention.

FIG. 1 shows a schematic structure of an OLED display device 100 in an embodiment according to the present invention. The OLED display device 100 in this embodiment includes a display area 101, an FPC (flexible printed circuit) 102, a driver IC 103, and a scanning line driving circuit 104a which are formed on a substrate 110. In the display area 101, a plurality of control signal lines g1-1 through g1-3 running laterally in FIG. 1, and a plurality of data signal lines d1 through d3 running vertically in FIG. 1, are located to cross each other. At intersections of the control signal lines g1-1 through g1-3 and the data signal lines d1 through d3, a plurality of pixels 105 are located in a matrix. In the example shown in FIG. 1, three control signal lines g1-1 through g1-3 and one data signal line d1 crossing each other are provided for one pixel 105. The OLED display device 100 is not limited to having such a structure.

As shown in FIG. 1, the OLED display device 100 may include an area 104b where a peripheral circuit other than the scanning line driving circuit 104a, a line and the like are formed. The area 104b is located at a position facing the scanning line driving circuit 104a while having the display area 101 therebetween. The positions of the scanning line driving circuit 104a and the area 104b where the peripheral circuit, the line and the like are formed are not limited to the positions shown in FIG. 1. Hereinafter, the area where the scanning line driving circuit 104a is located in FIG. 1 will be referred to as a "peripheral circuit area 104a", and the area 104b where the other peripheral circuit and the like are formed will be referred to as a "peripheral circuit area 104b". The scanning line driving circuit 104a, the peripheral circuit, the line and the like may be formed at either one of the peripheral circuit areas 104a and 104b.

In each of pixels 105, a pixel circuit is located. The pixel circuit includes a capacitor for storing a data voltage supplied from the data signals d1 through d3 and a thin film transistor for controlling light emission of the corresponding pixel 105 by controlling write of a data voltage supplied to the corresponding pixel 105 in accordance with a control signal supplied from the control signals g1-1 through g1-3.

Hereinafter, with reference to FIGS. 2A and 2B, a structure of the pixel 105 will be described in more detail.

Figure 2A:
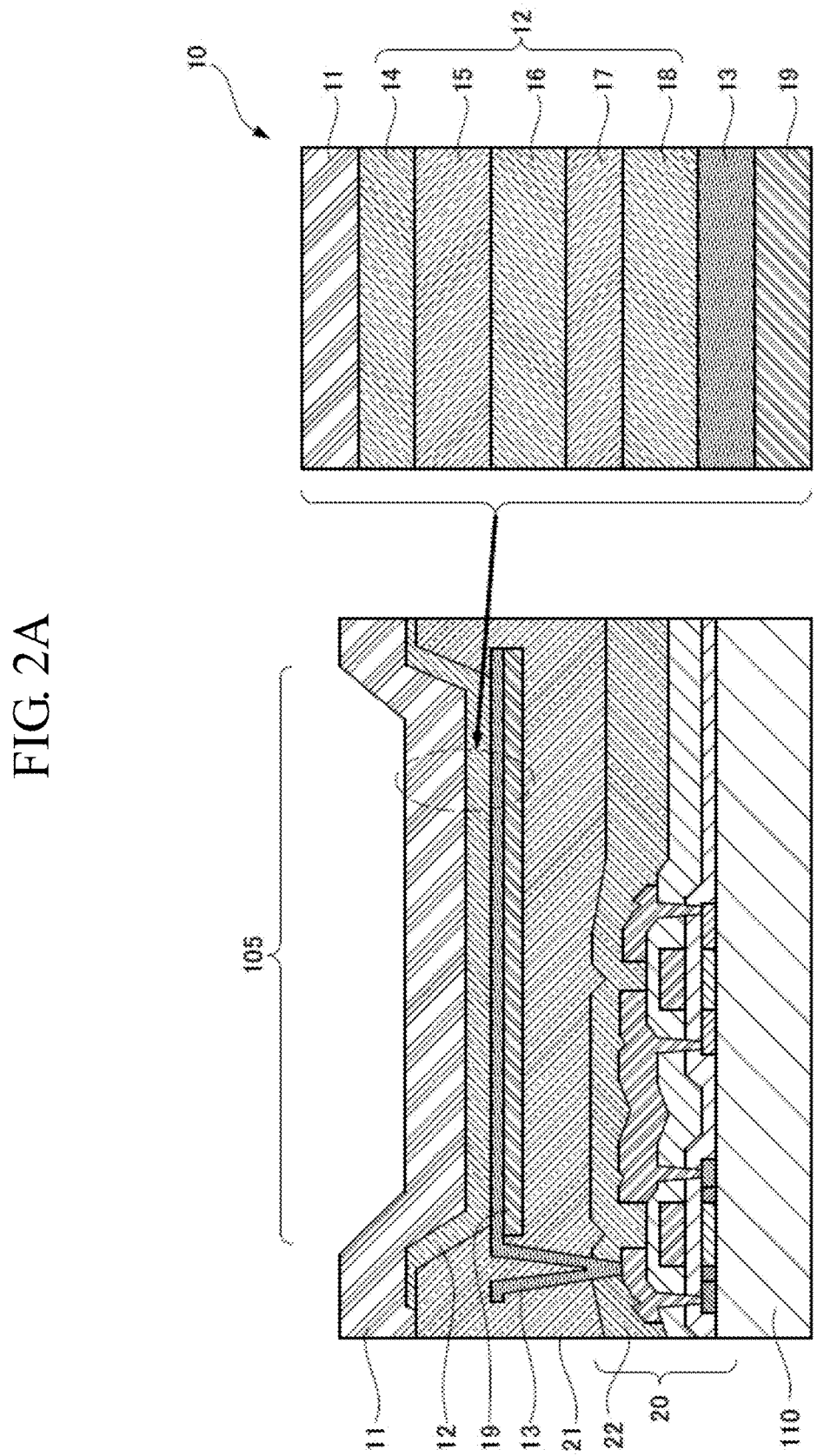
FIG. 2A is a cross-sectional view showing a schematic structure of an OLED display device in an embodiment according to the present invention.

FIG. 2A is a cross-sectional view showing a schematic structure of the pixel 105 usable for the OLED display device 100 in an embodiment according to the present invention. FIG. 2B is a circuit diagram showing an example of pixel circuit 20 usable for the OLED display device 100 in an embodiment according to the present invention.

As shown in FIG. 2A, the pixel 105 includes the pixel circuit 20 formed on the substrate 110, and an OLED element 10 formed on the pixel circuit 20 while having an insulating film 22 and a flattening film 21 therebetween. The OLED element 10 includes an anode 13 formed on a reflective film 19, an organic EL (electro-luminescence) layer 12 formed on the anode 13, and a cathode 11 formed on the organic EL layer 12. The organic EL layer 12 includes a hole injection layer (HIL) 18, a hole transporting layer (HTL) 17, a light emitting layer (EML) 16, an electron transporting layer (ETL) 15, and an electron injection layer (EIL) 14 which are stacked sequentially. The anode 13 is an electrode which is located for each pixel 105 and supplies an electric current to the organic EL layer 12. The cathode 11 is an electrode located in correspondence with all the pixels 105 and thus acts as a common electrode. The OLED display device 100 including the pixel circuit 20 shown in FIG. 2A is of a top emission type. Therefore, the cathode 11 is formed of a light-transmissive material such that light emitted from the organic EL layer is transmitted through the cathode 11.

Figure 2B:
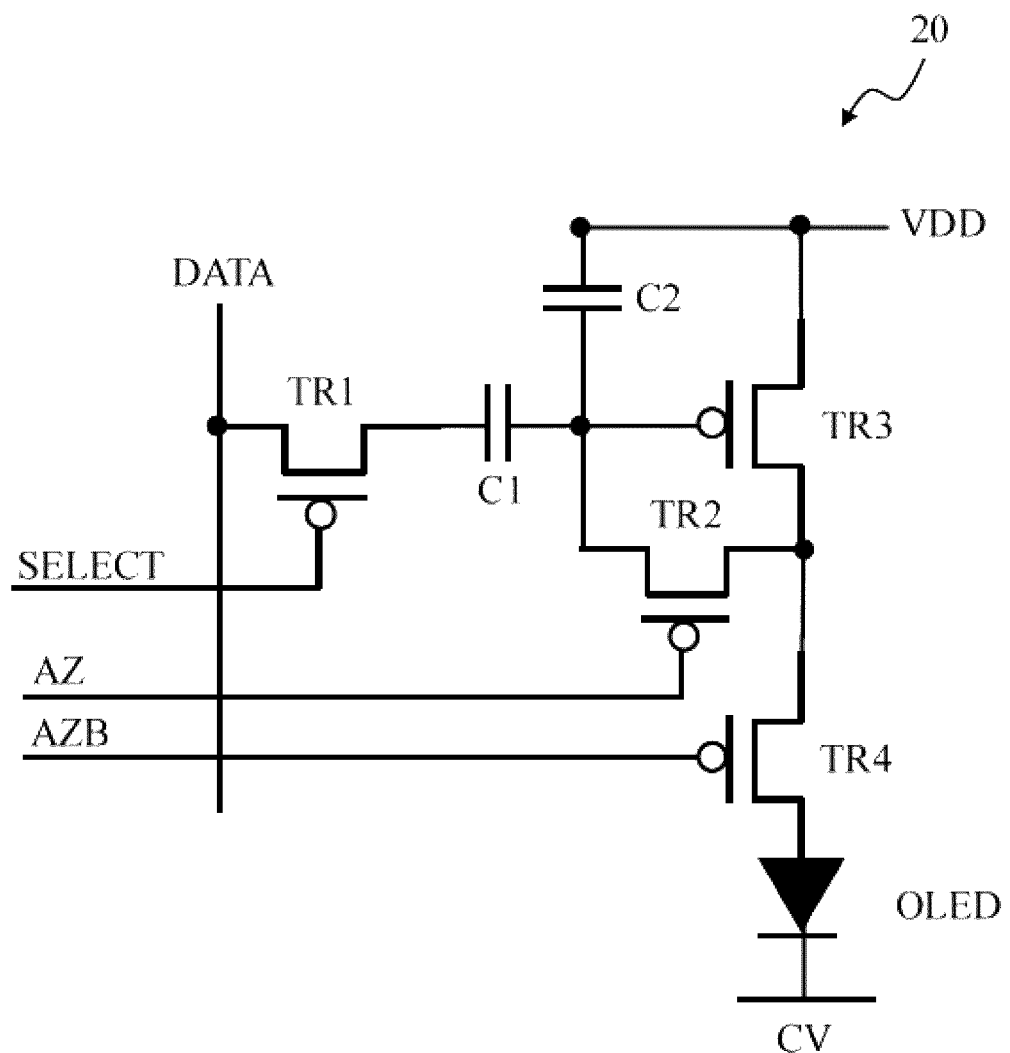
FIG. 2B is a circuit diagram showing an example of pixel circuit usable for an OLED display device in an embodiment according to the present invention.

As shown in FIG. 2B, the pixel circuit 20 of each pixel 105 may include four transistors TR1 through TR4, two capacitors C1 and C2, and the OLED element 10 (represented as "OLED" in FIG. 2B). A source of the transistor TR1 is connected to a data voltage line DATA (data signal line d1 shown in FIG. 1). A drain of the transistor TR1 is connected to one of electrodes of the capacitor C1. A gate of the transistor TR1 is connected to a scanning electrode line SELECT (control signal line g1-1 shown in FIG. 1). A source of the transistor TR2 is connected commonly to the other electrode of the capacitor C1, one of electrodes of the capacitor C2 and a gate of the transistor TR3. A drain of the transistor TR2 is commonly connected to a drain of the transistor TR3 and a source of the transistor TR4. A gate of the transistor TR2 is connected to a control signal line AZ (control signal line g1-2 shown in FIG. 1). A drain of the transistor TR4 is connected to the anode 13 of the OLED element 10. A gate of the transistor TR4 is connected to a control signal line AZB (control signal line g1-3 shown in FIG. 1). A source of the transistor TR3 and the other electrode of the capacitor C2 are supplied with a first power supply voltage, and the cathode 11 of the OLED element 10 is supplied with a second power supply voltage. In an embodiment according to the present invention, the first power supply voltage is an anode voltage VDD, and the second power supply voltage is a cathode voltage CV. As the cathode voltage CV, a reference voltage or a negative voltage is used.

The pixel circuit 20 having such a structure is arranged as follows. Variance of an operation threshold value of the transistor TR3 is corrected, and then the capacitors C1 and C2 and the like are allowed to store a voltage. Owing to this, the OLED element 10 is allowed to emit light at a luminance corresponding to a data voltage supplied from the data voltage line DATA. Therefore, the pixel circuit 20 having the structure shown in FIG. 2B is used for an OLED display device or the like in which variance of the transistor characteristics, a power supply voltage drop or the like directly influences the display.

Figure 9:
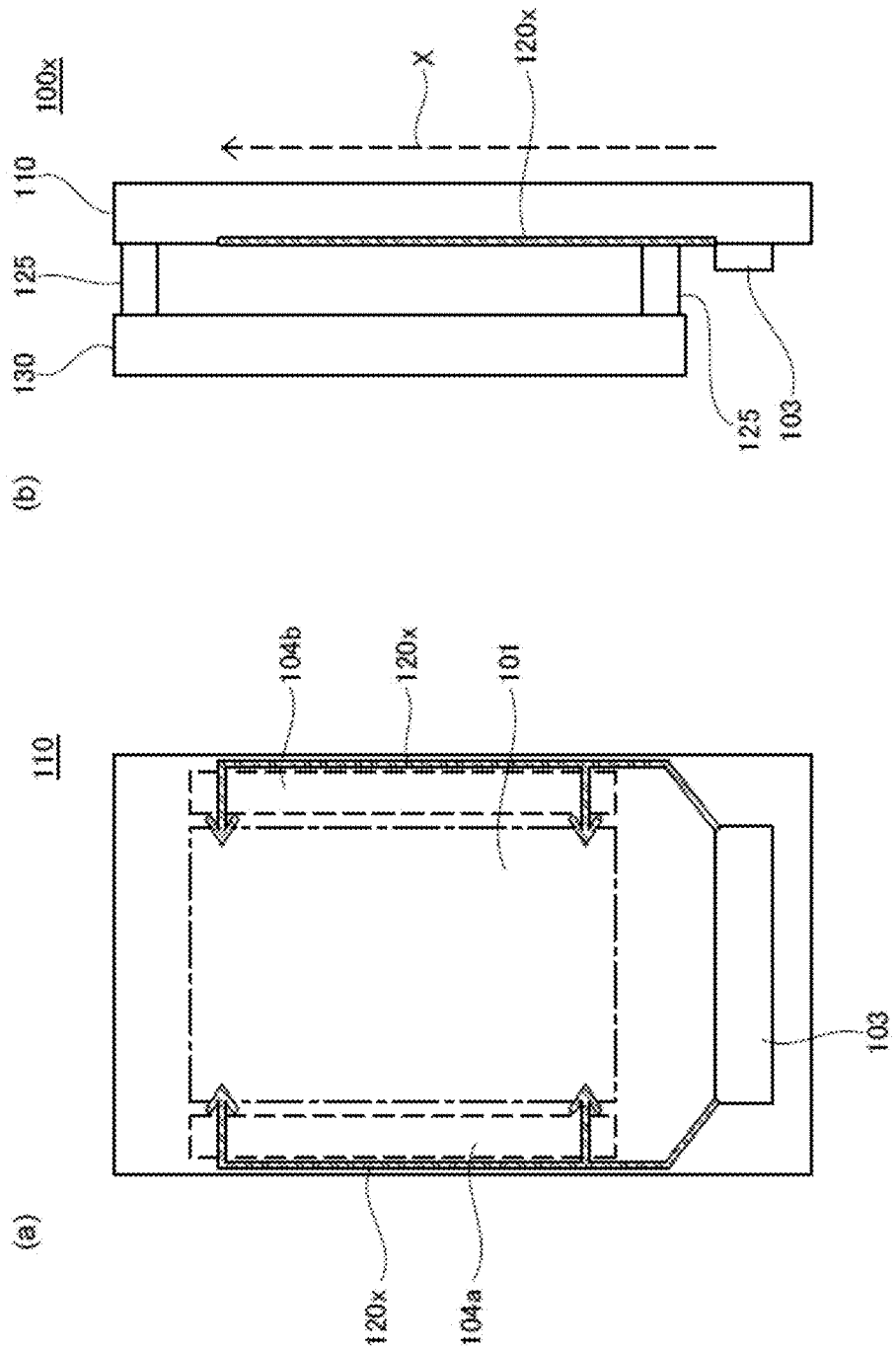
FIG. 9 shows a structure of a conventional OLED display device.

Hereinafter, with reference to FIG. 9, a structure of a conventional OLED display device 100x including the pixel circuit 20 will be described. FIG. 9 shows a structure of the conventional OLED display device 100x. FIG. 9(a) is a plan view showing an array substrate 110, and FIG. 9(b) is a cross-sectional view showing the OLED display device 100x. Elements of the conventional OLED display device 100x that are identical to those of the OLED display device 100 described above with reference to FIG. 1 will bear identical reference numerals thereto, and descriptions thereof will be omitted.

Like the OLED display device 100, the conventional OLED display device 100x shown in FIG. 9 includes a substrate 110 including a display area 101 having a plurality of pixels 105, peripheral circuit areas 104a and 104b and a driver IC 103 (hereinafter, this substrate will be referred to as an "array substrate 110"), and a counter substrate 130 bonded with the array substrate 110 with a sealing member 125 or the like. The array substrate 110 and the counter substrate 130 may each be formed of a glass substrate. The counter substrate 130 may include a color filter, or may be a thin film device or the like having a touch panel function.

As shown in FIG. 9, in the conventional OLED display device 100x, a power supply voltage is supplied, for example, from a power supply such as the driver IC 103 or the like to the cathode 11 located in the display area 101 via power supply lines 120x located in the array substrate 110. The power supply voltage is not limited to being supplied from the driver IC 103 shown in FIG. 9, and may be supplied from an external power supply (not shown). In FIG. 9, the current paths of the power supply lines 120x are shown as "120x" in a simplified manner. The arrows of the power supply lines 120x shown in FIG. 9(a) and dashed arrow X shown in FIG. 9(b) represent directions in which the power supply voltage is transmitted. Although not shown in FIG. 9(a), the cathode 11 is located to cover all the pixels 105 in the display area 101 and acts as a common electrode. The structure shown in FIG. 9(a) is merely an example, and the cathode 11 may be connected to the power supply lines 120x at a plurality of positions and supplied with a power supply voltage as represented by the arrows of the power supply lines 120x in the display area 101. FIG. 9(a) shows an example in which the power supply lines 120x are connected to the cathode 11 at four corners of the display area 101, which is rectangular.

As shown in FIG. 9(a), the power supply lines 120x connected to the cathode 11 in the display area 101 are located in an area on the array substrate 110 excluding the display area 101 represented by the chain line in FIG. 9(a) and the peripheral circuit areas 104a and 104b. The power supply lines 120x are required to supply a power supply voltage to all the pixels 105 in the entire display area 101 uniformly and sufficiently but not excessively. For realizing this, the power supply lines 120x need to have a low resistance.

However, in the conventional OLED display device 100x, the above-described margin area on the array substrate 110 excluding the display area 101 and the peripheral circuit areas 104a and 104b is the only area where the power supply lines 120x can be located. Thus, the width of the power supply lines 120x is restricted. The width of the power supply lines 120x tends to be more restricted for the following reasons, for example. As the screen of the display device is enlarged, lines are extended; as the display precision is raised, the circuits other than the power supply lines 120x are complicated and enlarged; and as the frame area becomes narrower, an area where the lines can be located is made smaller. Since the width of the power supply lines 120x is more restricted, it is difficult to lower the resistance thereof. Where an arrangement in which a plurality of types of power supply lines are provided on the array substrate or the power supply lines on the array substrate are formed of a plurality of layers is adopted, the resistance is lowered to a certain level. However, such an arrangement complicates the structure of the display device and puts a limit on the improvement in the display performance. The present inventor made researches for a structure of an OLED display device which can improve the image quality without causing luminance gradient, which would be caused by a high resistance of the power supply lines 120x, and can realize a large screen, a high precision and a small frame area. Thus, the present inventor achieved the present invention.

Embodiment 1

Figure 3:
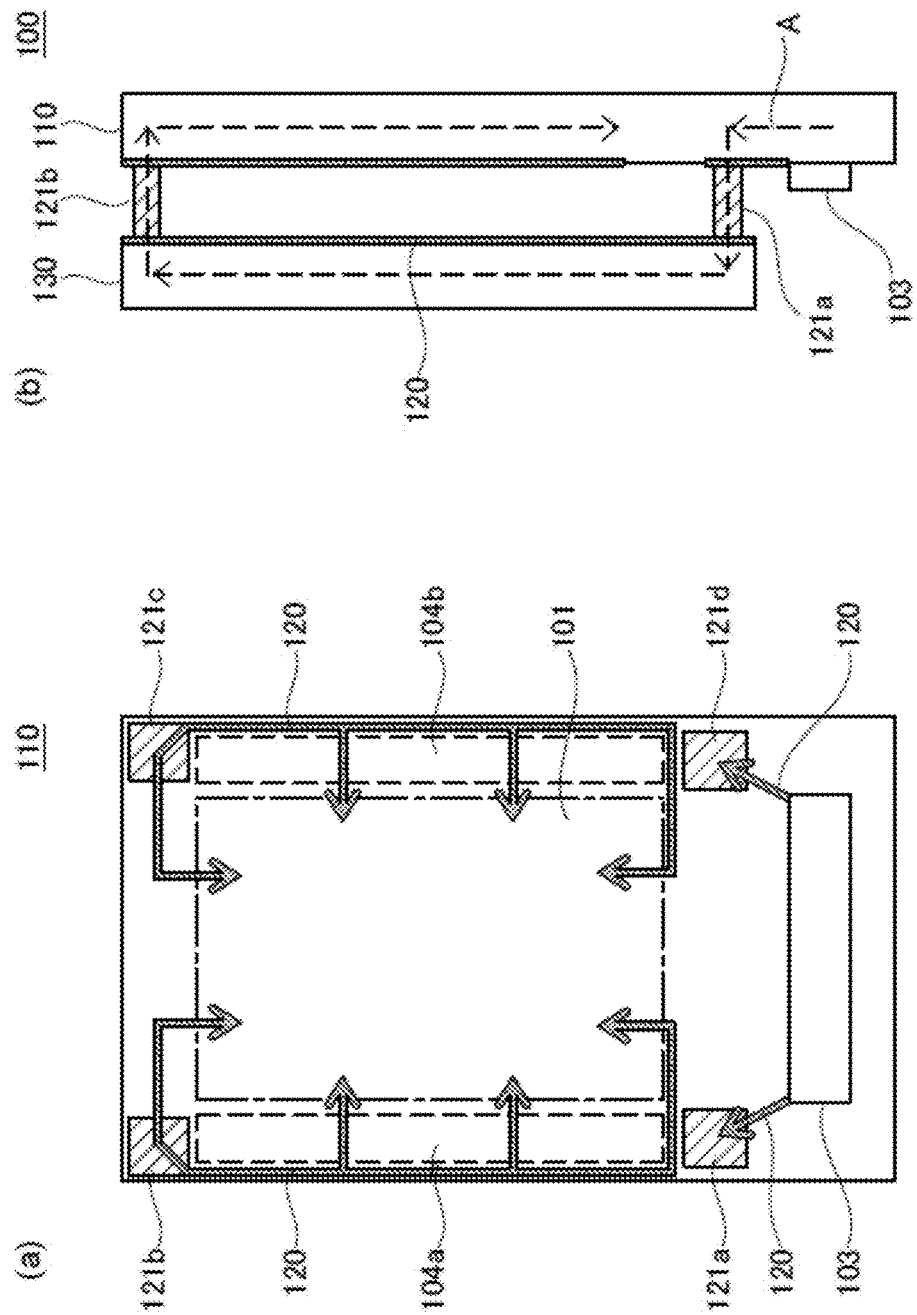
FIG. 3 shows a structure of an OLED display device in Embodiment 1 according to the present invention.
Figure 4:
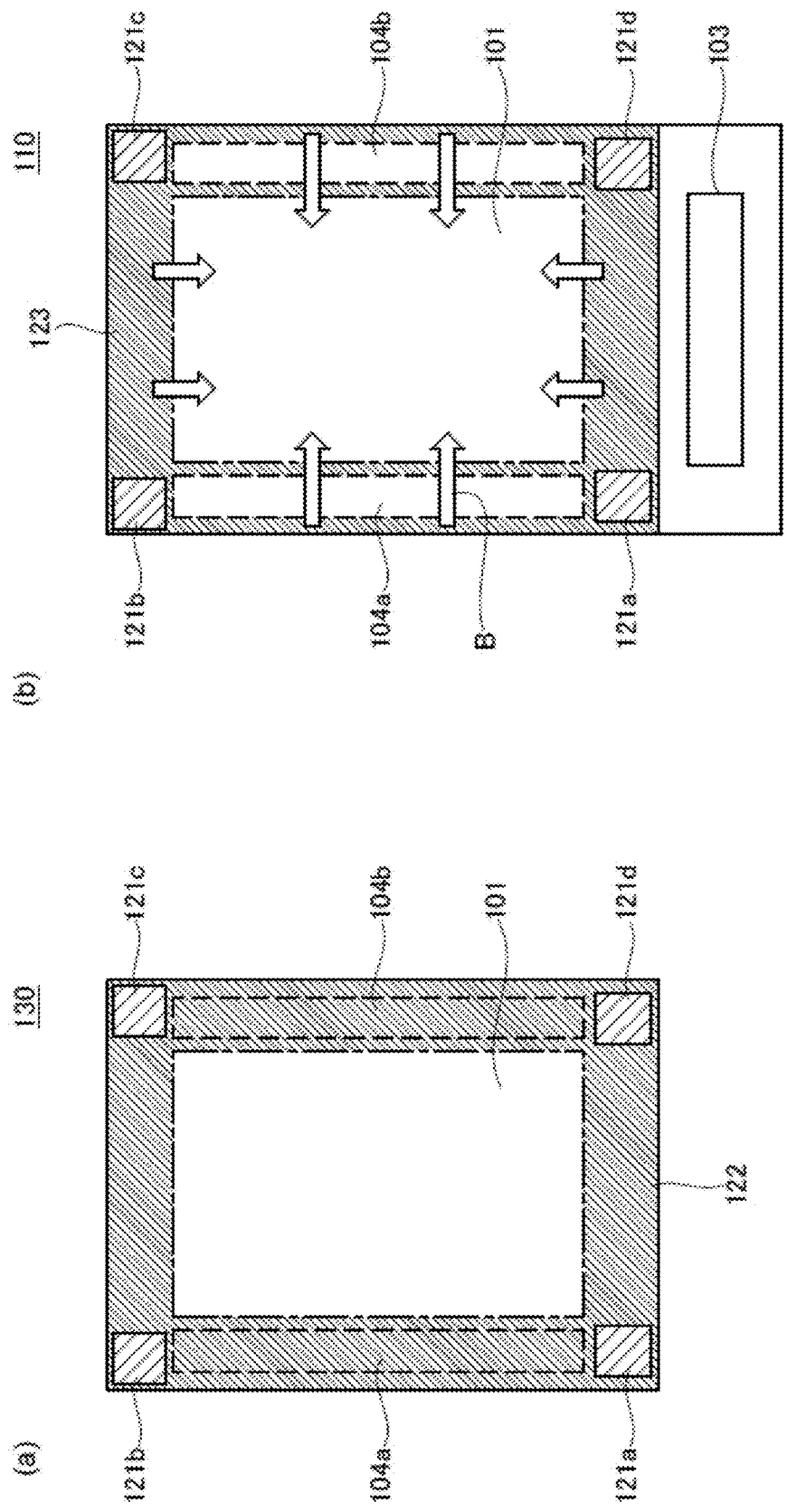
FIG. 4 shows a structure of the OLED display device in Embodiment 1 according to the present invention.

Hereinafter, with reference to FIG. 3 and FIG. 4, a structure of an OLED display device 100 in Embodiment 1 according to the present invention will be described. FIG. 3 shows a structure of the OLED display device 100 in Embodiment 1 according to the present invention. FIG. 3(a) is a plan view showing an array substrate 110, and FIG. 3(b) is a cross-sectional view showing the OLED display device 100. FIG. 4 shows a structure of the OLED display device 100 in Embodiment 1 according to the present invention. FIG. 4(a) is a plan view of a counter substrate 130, and FIG. 4(b) is a plan view of the array substrate 110. Hereinafter, elements identical to those of the conventional OLED display device 100x described above with reference to FIG. 9 will bear identical reference numerals thereto, and the descriptions thereof will be omitted.

As shown in FIG. 3, the OLED display device 100 in Embodiment 1 includes the array substrate 110 including a display area 101 having a plurality of pixels 105, peripheral circuit areas 104a and 104b and a driver IC 103, and also includes the counter substrate 130 bonded to the array substrate 110 with a sealing member 125 (not shown in FIG. 3) or the like. The OLED display device 100 in Embodiment 1 also includes conductive members 121a through 121d between the array substrate 110 and the counter substrate 130. Power supply lines 120 formed on the array substrate 110 and power supply lines 120 formed on the counter substrate 130 are conductive to each other via the conductive members 121a through 121d.

The power supply lines 120 may be formed of a known material, for example, ITO, aluminum, gold, silver, copper or the like. The conductive members 121a through 121d are formed of, for example, a conductive resin or an anisotropic conductive film (ACF). FIG. 3(a) shows the power supply lines 120 as extending in an area inner to the conductive members 121a through 121d for the sake of explanation. In actuality, however, the conductive members 121a through 121d are formed on the power supply lines 120 which are formed on the array substrate 110 and the counter substrate 130, and the array substrate 110 and the counter substrate 130 are connected to each other via the conductive members 121a through 121d. The positions of the power supply lines 120 and the conductive members 121a through 121d are not limited to those shown in FIG. 3, as described later.

The arrows of the power supply lines 120 shown in FIG. 3(a) and dashed arrow A shown in FIG. 3(b) represent directions in which a cathode power supply voltage is transmitted. The cathode power supply voltage is transmitted from the driver IC 103 on the array substrate 110 to the power supply lines 120 on the array substrate 110, then is transmitted to the power supply lines 120 on the counter substrate 130 via the conductive members 121a and 121d, then is transmitted to the power supply lines 120 on the array substrate 110 via the conductive members 121b and 121c, and then is supplied to the cathode 11 in the display area 101.

The power supply lines 120 on the counter substrate 130 can be located in an area 122 shown in FIG. 4(a). The area 122 is a frame area of the counter substrate 130 that does not overlap the display area 101. Therefore, the width of the power supply lines 120 can be determined by maximum use of the width of the frame area of the counter substrate 130. Thus, the power supply lines 120 can have a low resistance. The power supply lines 120 on the array substrate 110 may be located at any positions of a margin area 123 shown in FIG. 4(b) excluding the display area 101 and the peripheral circuit areas 104a and 104b. Owing to this, as represented by arrows B in FIG. 4(b) which indicate directions in which the power supply voltage is transmitted, the cathode power supply voltage can be transmitted from four sides of the rectangular display area 101 to all the pixels 105 uniformly with a low resistance. Therefore, the power supply voltage can be supplied such that luminance gradient does not occur between the pixels 105 in a proximal part of the display area 101 that are located on the power supply side and the pixels 105 in a distal part of the display area 101 that are located on the side opposite to the power supply. As a result, image deterioration of the OLED display device 100 can be reduced.

As the structure of the power supply lines 120, the power supply lines 120 shown in FIG. 3 and FIG. 4 which are located on the array substrate 110 and the counter substrate 130 and connected to each other via the conductive members 121a through 121d, and the power supply lines 120x shown in FIG. 9 which are located only on the array substrate 110 may be combined.

In FIG. 3(a), the power supply lines 120 on the counter substrate 130 are located on a surface of the counter substrate 130 that faces the array substrate 110. The power supply lines 120 are not limited to being located on such a surface, and may be located on a surface of the counter substrate 130 that does not face the array substrate 110. In the case where, for example, the counter substrate 130 is a color filter substrate, the power supply lines 120 may be located on a protective film covering a stack of films including the color filter.

In FIG. 3 and FIG. 4, the conductive members 121a through 121d are located at four corners of the frame areas 122 and 123 surrounding the display area 101. The number of the conductive members is not limited to four. The number of the conductive members may be variable in accordance with how much the frame areas of the OLED display device 100 are made narrower, and may be any number of one or greater. The conductive members may be located at any positions in the areas 122 and 123 where the power supply lines 120 can be located.

As described above, the OLED display device 100 in Embodiment 1 according to the present invention is structured such that the power supply lines 120 formed on the array substrate 110 and the power supply lines 120 formed on the counter substrate 130 are connected to each other via the conductive members 121a through 121d, and such that the resistance of the power supply lines 120 is lowered by use of the frame area 122 of the counter substrate 130. Owing to this, the resistance of the power supply lines 120 can be lowered with no restriction on the width thereof on the array substrate 110.

Thus, the OLED display device 100 in Embodiment 1 according to the present invention can improve image quality without causing luminance gradient, which would be caused by a high resistance of the power supply lines 120, and also can realize a large screen, a high precision and a narrow frame area.

Embodiment 2

Figure 5:
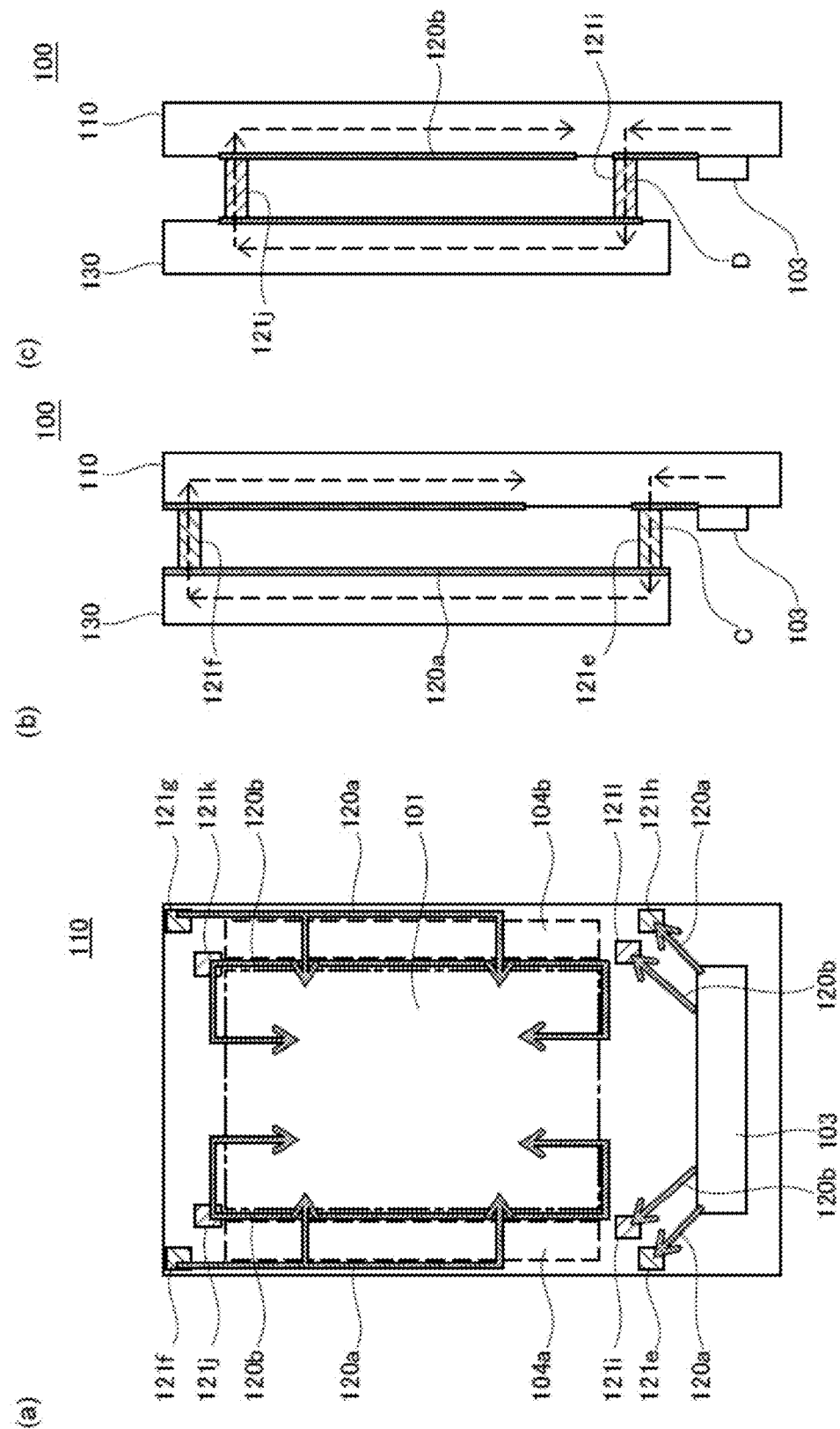
FIG. 5 shows a structure of an OLED display device in Embodiment 2 according to the present invention.
Figure 6:
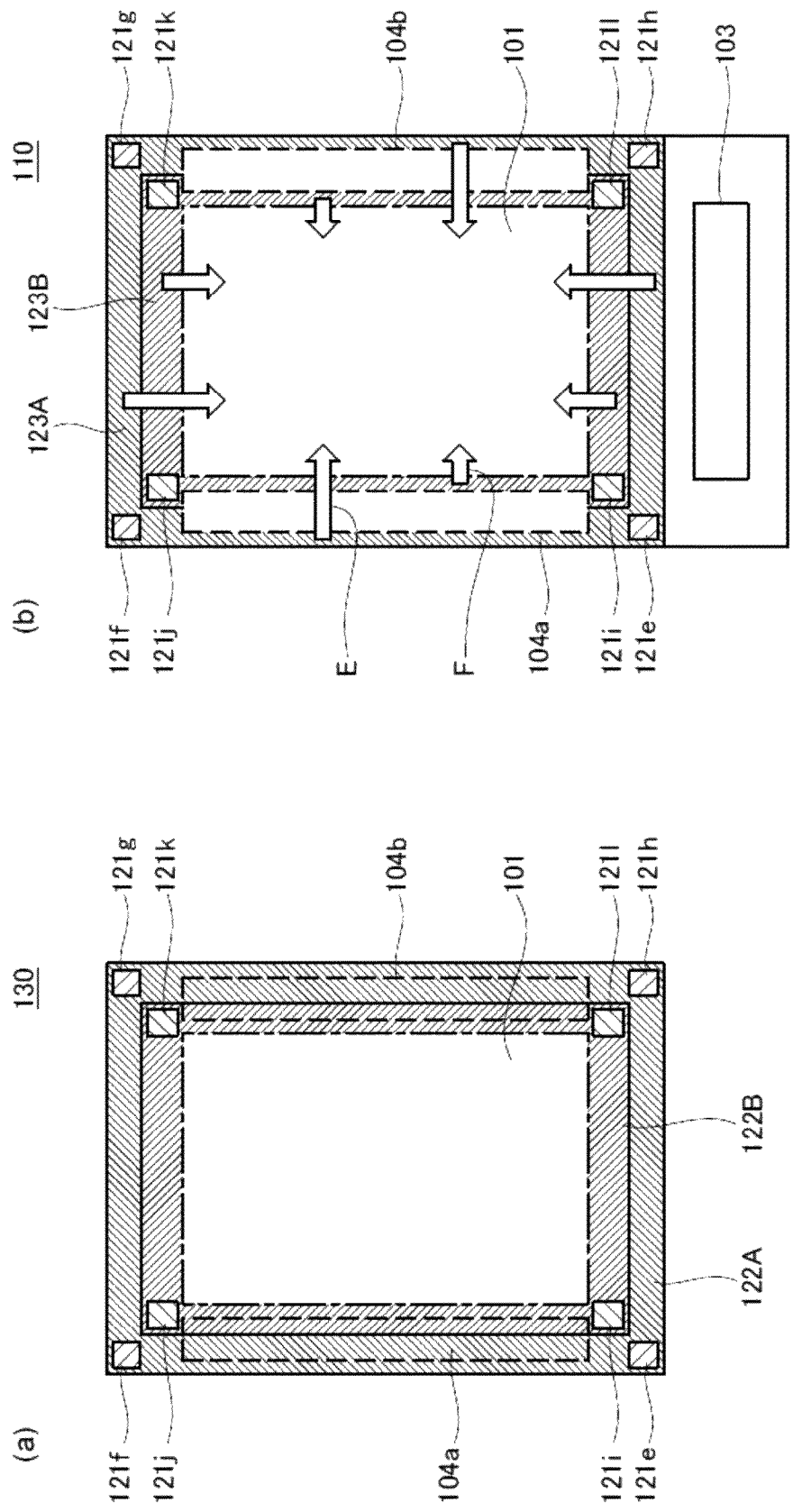
FIG. 6 shows a structure of the OLED display device in Embodiment 2 according to the present invention.

Hereinafter, with reference to FIG. 5 and FIG. 6, a structure of an OLED display device 100 in Embodiment 2 according to the present invention will be described. FIG. 5 shows a structure of the OLED display device 100 in Embodiment 2 according to the present invention. FIG. 5(a) is a plan view showing an array substrate 110, and FIGS. 5(b) and 5(c) are each a cross-sectional view showing the OLED display device 100. FIG. 6 shows the structure of the OLED display device 100 in Embodiment 2 according to the present invention. FIG. 6(a) is a plan view of a counter substrate 130, and FIG. 6(b) is a plan view of the array substrate 110. Hereinafter, elements identical to those of the OLED display device 100 in Embodiment 1 described above with reference to FIG. 3 and FIG. 4 will bear identical reference numerals thereto, and the descriptions thereof will be omitted.

As shown in FIG. 5 and FIG. 6, the OLED display device 100 in Embodiment 2 includes two types of power supply lines 120a and 120b located on the array substrate 110 and the counter substrate 130, and eight conductive members 121e through 121l. In the OLED display device 100 in Embodiment 2, the plurality of types of power supply lines are provided to realize a plurality of power supplies with a low resistance.

As shown in FIG. 5 and FIG. 6, the power supply lines 120a located on the array substrate 110 are connected to the power supply lines 120a located on the counter substrate 130 via the conductive members 121e through 121h located in areas 122A and 123A, which are outer parts of frame areas of the counter substrate 130 and the array substrate 110. The power supply lines 120b located on the array substrate 110 are connected to the power supply lines 120b located on the counter substrate 130 via the conductive members 121i through 121l located in areas 122B and 123B, which are parts of the frame areas of the counter substrate 130 and the array substrate 110 that are inner and thus closer to the display area 101.

Owing to such a structure of the OLED display device 100 in Embodiment 2, a cathode power supply voltage is transmitted as follows as represented by dashed arrows C and D in FIGS. 5(b) and 5(c). The cathode power supply voltage is transmitted from the driver IC 103 on the array substrate 110 to the power supply lines 120a and 120b on the array substrate 110, then is transmitted to the power supply lines 120a and 120b on the counter substrate 130 via the conductive members 121e and 121h and the conductive members 121i and 121l, then is transmitted to the power supply lines 120a and 120b on the array substrate 110 via the conductive members 121f and 121g and the conductive members 121j and 121k, and is supplied to the cathode 11 in the display area 101. The plurality of types of power supply lines 120a and 120b are not limited to being connected to the cathode 11, and may be connected to any other component to supply the power supply voltage although not shown.

As described above, the OLED display device 100 in Embodiment 2 according to the present invention is structured such that the resistance of each of the power supply lines 120a and 120b is lowered by use of the frame areas 122A and 122B of the counter substrate 130. Owing to this, as represented by arrows E and F in FIG. 6(b) which indicate directions in which the power supply voltage is transmitted, the power supply voltage can be supplied from four sides of the rectangular display area 101 to all the pixels 105 uniformly with a low resistance.

Thus, the OLED display device 100 in Embodiment 2 according to the present invention including the plurality of types of power supply lines 120a and 120b also can lower the resistance of each of the power supply lines 120a and 120b by use of the frame areas 122A and 122B of the counter substrate 130, like the OLED display device 100 in Embodiment 1. Thus, the OLED display device 100 in Embodiment 2 can supply the power supply voltage to all the pixels 105 without causing luminance gradient.

Embodiment 3

Figure 7:
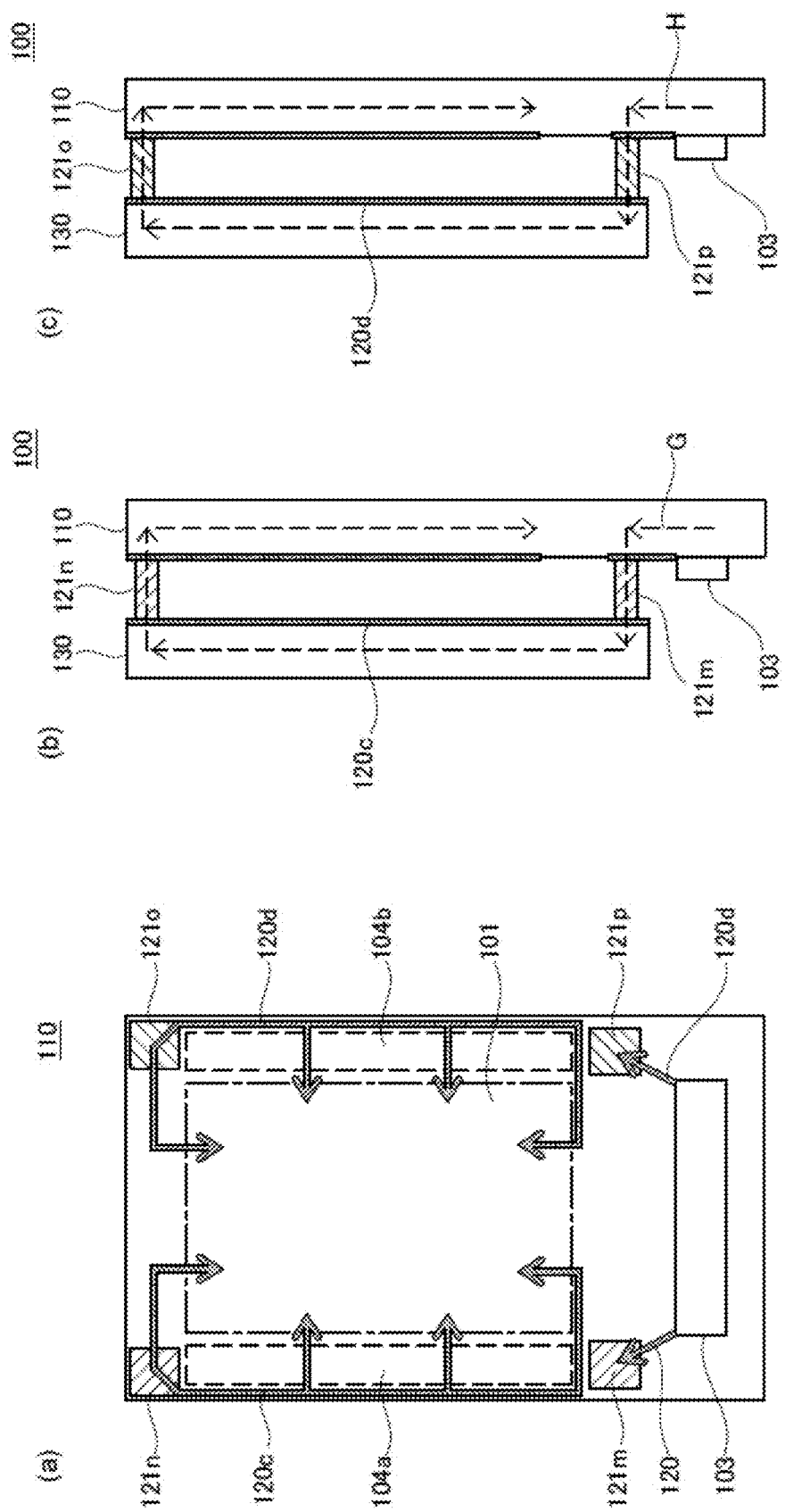
FIG. 7 shows a structure of an OLED display device in Embodiment 3 according to the present invention.
Figure 8:
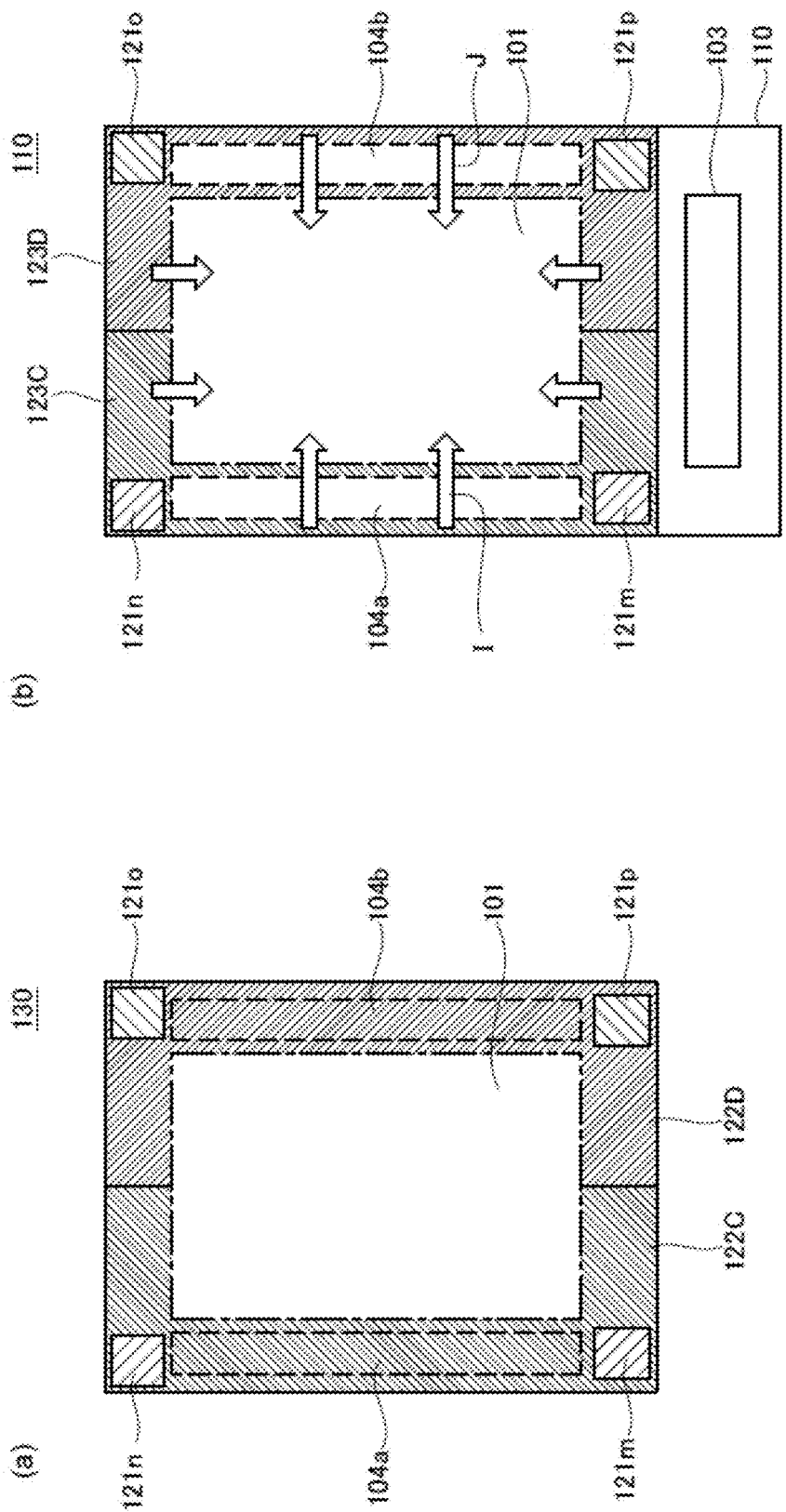
FIG. 8 shows a structure of the OLED display device in Embodiment 3 according to the present invention.

Hereinafter, with reference to FIG. 7 and FIG. 8, a structure of an OLED display device 100 in Embodiment 3 according to the present invention will be described. FIG. 7 shows a structure of the OLED display device 100 in Embodiment 3 according to the present invention. FIG. 7(a) is a plan view showing an array substrate 110, and FIGS. 7(b) and 7(c) are each a cross-sectional view showing the OLED display device 100. FIG. 8 shows a structure of the OLED display device 100 in Embodiment 3 according to the present invention. FIG. 8(a) is a plan view of a counter substrate 130, and FIG. 8(b) is a plan view of the array substrate 110. Hereinafter, elements identical to those of the OLED display devices 100 in Embodiment 1 and 2 described above with reference to FIG. 3 through FIG. 6 will bear identical reference numerals thereto, and the descriptions thereof will be omitted.

As shown in FIG. 7 and FIG. 8, the OLED display device 100 in Embodiment 3 includes two types of power supply lines 120c and 120d located on the array substrate 110 and the counter substrate 130, and four conductive members 121m through 121p. In the OLED display device 100 in Embodiment 3, a plurality of power supplies are provided with a low resistance, like in the OLED display device 100 in Embodiment 2.

In the OLED display device 100 in Embodiment 3, a cathode power supply voltage is transmitted as follows as represented by dashed arrows G and H FIGS. 7(b) and 7(c). The cathode power supply voltage is transmitted from the driver IC 103 on the array substrate 110 to the power supply lines 120c and 120d on the array substrate 110, then is transmitted to the power supply lines 120c and 120d on the counter substrate 130 via the conductive members 121m and 121p, then is transmitted to the power supply lines 120c and 120d on the array substrate 110 via the conductive members 121n and 121o, and is supplied to a cathode 11 in the display area 101. Like in the OLED display device 100 in Embodiment 2, the plurality of types of power supply lines 120c and 120d are not limited to being connected to the cathode 11, and may be connected to any other component to supply the power supply voltage.

As shown in FIG. 8, the power supply lines 120c and 120d are respectively located on a left area 123C and a right area 123D on the array substrate 110, and are respectively located on a left area 122C and a right area 122D on the counter substrate 130. The left area 123C and the right area 123D are parts of the frame area surrounding the display area 101 of the array substrate 110 and have a center line therebetween. The left area 122C and the right area 122D are parts of the frame area of the counter substrate 130 and have a center line therebetween. Owing to the structure in which the different types of power supply lines 120c and 120d are located on the left areas 123C and 122C and the right areas 123D and 122D, different power supply voltages may be transmitted by the power supply lines 120c and 120d. In this case, the pixels 105 in a left half of the display area 101 and the pixels 105 in a right half of the display area 101 are provided with different power supply voltages. Alternatively, as represented by arrows I and J in FIG. 8(b) which indicate directions in which the power supply voltage is transmitted, the power supply voltage can be supplied from four sides of the rectangular display area 101 to all the pixels 105 uniformly with a low resistance.

In FIG. 8, the frame areas surrounding the display area 101 are divided into the left areas 122C and 123C and the right areas 122D and 123D along the center lines, and the power supply lines 120c and 120d are located on the left areas and the right areas. The frame areas are not limited to being divided along the center lines, and the positions of the power supply lines 120c and 120d may be appropriately changed in accordance with the specifications.

As described above, the OLED display device 100 in Embodiment 3 according to the present invention is structured such that the resistance of each of the power supply lines 120c and 120d is lowered by use of the frame areas 122C and 122D of the counter substrate 130. Owing to this structure, the OLED display device 100 in Embodiment 3 according to the present invention including the plurality of types of power supply lines 120c and 120d also can supply the power supply voltage to all the pixels 105 without causing luminance gradient, like in the OLED display devices 100 in Embodiments 1 and 2.

As described above, in the OLED display devices 100 in Embodiments 1 through 3 according to the present invention, the power supply lines 120 and 120a through 120d are provided in the frame area of the counter substrate 130. Owing to this, the power supply lines 120 and 120a through 120d can supply the power supply voltage at a low resistance without being restricted by the area of the array substrate 110 where the power supply lines 120 and 120a through 120d can be located. Therefore, the OLED display devices 100 can improve image quality without causing luminance gradient, which would be caused by a high resistance of the power supply lines, and also can realize a narrow frame area.

What is claimed is:

1. An OLED display device, comprising:
   a first substrate including a plurality of pixels, a display area overlapped with the plurality of pixels in a planar view, and a peripheral area located outside the display area;
   a second substrate facing the first substrate;
   a light emitting element including a first electrode, a second electrode, and a light emitting layer, the second electrode located at a second substrate side of the first electrode, the light emitting layer located between the first electrode and the second electrode, the light emitting element located in each of the pixels;
   a first line located on the first substrate;
   a second line located on the first substrate, the second line not being directly connected with the first line;
   a third line located on the second substrate and overlapped with the peripheral area in a planar view;
   a first conductive member located on a first region of the peripheral area, and formed between the first substrate and the second substrate;

a second conductive member located on a second region of the peripheral area, and formed between the first substrate and the second substrate, the second region being different from the first region;

wherein the first conductive member is connected with the first line on the first substrate, and connected with the third line on the second substrate, the second conductive member is connected with the second line on the first substrate, and connected with the third line on the second substrate, and the second line is connected with the second electrode without interposing the light emitting layer.

2. An OLED display device according to claim 1, wherein the second line is connected with the second electrode at a plurality of positions.

3. An OLED display device according to claim 1, wherein the display area has a first side and a second side facing the first side, the first region is adjacent to the first side, and the second region is adjacent to the second side.

4. An OLED display device according to claim 3, wherein the display area has a third side and a fourth side, the third side intersecting the first side and the second side, the fourth side facing the third side, the second line includes a plurality of second lines, and the second electrode is connected with the plurality of second lines at four positions, each of the four positions being adjacent to each of the first side, the second side, the third side, and the fourth side.

5. An OLED display device according to claim 1, wherein the peripheral area includes a peripheral circuit area where a driving circuit is formed, and a part of the second line extends a region between the peripheral circuit area and an end of the first substrate.

6. An OLED display device according to claim 1, wherein the peripheral area includes a peripheral circuit area where a driving circuit is formed, the second line includes a fourth line and a fifth line, the fourth line extends a region between the peripheral circuit area and the display area, and the fifth line extends a region between the peripheral circuit area and an end of the first substrate.

7. An OLED display device according to claim 1, wherein the first line includes a sixth line and a seventh line, the first conductive member includes a third conductive member connected with the sixth line, and a fourth conductive member connected with the seventh line, a first voltage is applied to the sixth line, a second voltage is applied to the seventh line, and the first voltage is different from the second voltage.

8. An OLED display device according to claim 7, wherein the display area has a first side having a first end and a second end opposite to the first end, the third conductive member is located at a first portion of the first region, the first portion being adjacent to the first end, and the fourth conductive member is located at a second portion of the first region, the second portion being adjacent to the second end.

9. An OLED display device according to claim 1, wherein a driver IC is formed on the first substrate, and the first line is connected with the driver IC.

10. An OLED display device, comprising:

a first substrate including a plurality of control signal lines and a plurality of data signal lines crossing each other, and a plurality of pixels located in a matrix at intersections of the plurality of control signal lines and the plurality of data signal lines; and a second substrate facing the first substrate;

wherein:

the plurality of pixels each include:

a pixel circuit to which a data voltage supplied from the corresponding data signal line is written in accordance with a control signal supplied from the corresponding control signal line; and an OLED display element including a first electrode supplied with a current from the pixel circuit in accordance with the data voltage, a second electrode supplied with a power supply voltage, and a light emitting layer located between the first electrode and the second electrode; and the first substrate includes a plurality of first power supply lines;

the second substrate includes a plurality of second power supply lines;

the plurality of first power supply lines and the plurality of second power supply lines are respectively connected to each other via a conductive member formed between the first substrate and the second substrate; and each of the plurality of first power supply lines is connected to the second electrode of the OLED display element without interposing the light emitting layer.

11. An OLED display device according to claim 10, wherein the plurality of second power supply lines are located in an area which does not overlap a display area of the first substrate where the plurality of pixels are located.

12. An OLED display device according to claim 10, wherein the conductive member is located in an area which does not overlap a display area of the first substrate where the plurality of pixels are located, the conductive member being located as connecting the first substrate and the second substrate to each other.

13. An OLED display device according to claim 10, wherein the conductive member is formed of a conductive resin or an anisotropic conductive film.

14. An OLED display device according to claim 10, wherein the second electrodes of the OLED display elements form one common electrode provided in correspondence with the plurality of pixels, and the common electrode is connected to the plurality of first power supply lines at a plurality of positions and thus is provided with the power supply voltage.

* * * * *